United States Patent [19]
Yamada et al.

[11] Patent Number: 5,401,684
[45] Date of Patent: Mar. 28, 1995

[54] METHOD OF MANUFACTURING A LIGHT-EMITTING SEMICONDUCTOR DEVICE SUBSTRATE

[75] Inventors: Masato Yamada; Takao Takenaka; Shinji Orimo, all of Annaka, Japan

[73] Assignee: Shin-Etsu Handatai Co., Ltd., Tokyo, Japan

[21] Appl. No.: 984,920

[22] Filed: Dec. 2, 1992

Related U.S. Application Data

[62] Division of Ser. No. 472,874, Jan. 31, 1990, abandoned.

[51] Int. Cl.$^6$ .................... H01L 21/208; H01L 33/00
[52] U.S. Cl. ........................... 437/126; 437/127; 437/130; 437/133; 437/905; 437/974; 148/DIG. 101; 148/DIG. 135
[58] Field of Search ............... 437/86, 126, 127, 128, 437/130, 133, 904, 905, 974; 148/DIG. 101, DIG. 135

[56] References Cited

U.S. PATENT DOCUMENTS

| | | | |
|---|---|---|---|
| 3,959,045 | 5/1976 | Antypas | 156/3 |
| 4,199,385 | 4/1980 | Hung et al. | 148/175 |
| 4,507,157 | 3/1985 | Oliver, Jr. | 148/171 |
| 4,540,451 | 9/1985 | Leibenzeder et al. | 148/173 |
| 4,902,356 | 2/1990 | Noguchi et al. | 148/33.4 |
| 4,921,817 | 5/1990 | Noguchi | 437/127 |
| 4,946,801 | 8/1990 | Sato et al. | 437/126 |
| 5,185,288 | 2/1993 | Cook et al. | 437/130 |

FOREIGN PATENT DOCUMENTS 0317228 5/1989 European Pat. Off.
62-14420 1/1987 Japan.

OTHER PUBLICATIONS

JP 59-159576 dated Sep. 10, 1984 for Manufacture of Semiconductor Device Appln. No. 58-33571.
JP 61 281560 dated Dec. 11, 1986 for Manufacture of Semiconductor Surface Light-Emitting Element Appln. No. 60-123071.

*Primary Examiner*—Mary Wilczewski
*Attorney, Agent, or Firm*—Longacre & White

[57] ABSTRACT

Disclosed are a light-emitting semiconductor device substrate and a method of manufacturing the same. The substrate is prepared by causing a $Ga_{1-x}Al_xAs$ compound semiconductor single crystalline thick-film layer having a first AlAs mole fraction and a low Al containing and oxidation-delaying $Ga_{1-y}Al_yAs$ compound semiconductor single crystalline thin film serving as a surface protective layer and having a second AlAs mole fraction to be sequentially grown on a GaAs crystal substrate. The method comprises the step of causing the thick-film layer and the thin film to be sequentially grown on the GaAs crystal substrate. The GaAs crystal substrate is removed after sequential epitaxial growth of the thick-film layer and thin film on the GaAs crystal substrate.

2 Claims, 5 Drawing Sheets

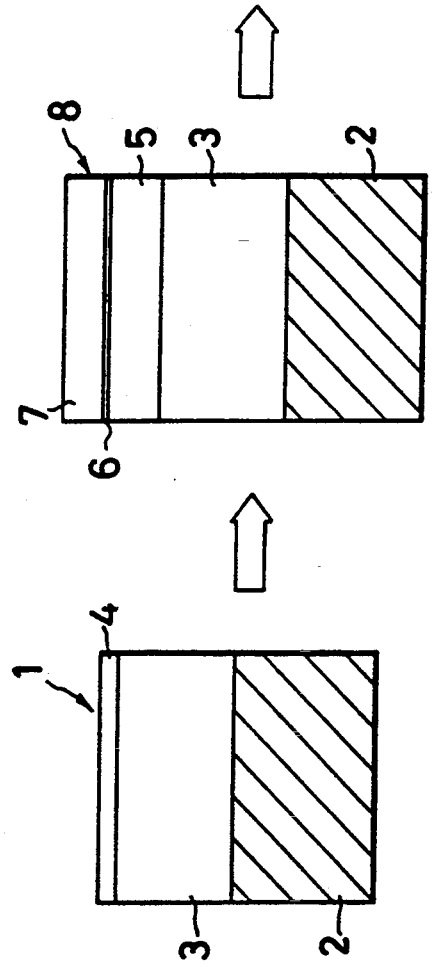

METHOD OF MANUFACTURING A LIGHT-EMITTING SEMICONDUCTOR DEVICE SUBSTRATE

This is a divisional of application Ser. No. 07/472,874, filed Jan. 31, 1990, now abandoned.

BACKGROUND OF THE INVENTION

1. Industrial Field Of The Invention

The present invention relates to a light-emitting semiconductor device substrate, especially, to a light-emitting semiconductor device substrate to be used for manufacture of a light-emitting semiconductor device made of GaAlAs which has a double hetero junction structure and to a method of manufacturing the same.

2. Statement Of The Related Art

A light-emitting device of solid state includes a fluorescent substance and a light-emitting diode. The light-emitting diode mainly employs, as a light-emitting material, a III-V compound semiconductor in single-crystal form or in mixed-crystal form. The emission of light from the light-emitting diode is effected by forward biasing the pn junction, thereby injecting minority carriers through the pn junction to recombine the minority carriers with the majority carriers.

The light-emitting mechanism of a light-emitting diode allows the emitted light to be particularly high in luminance compared with that of the fluorescent materials. The light-emitting diode is suitable for space limiting emission of light or for complicated displays. In addition, the excitation energy is obtained with impression of a simple low-voltage direct current source. Further, the other features such as multicolor characteristics, high reliability, low power consumption and high speed response make it compatible with semiconductor integrated circuits. Thus, the practical use of the light-emitting diodes has been increasingly expanded.

In the initial stage, the areas of practical use of the light-emitting diodes were principally two in number; one is that of lamps to be used as point light sources for display and the other is that of displays. With technological improvement on output capacity of this kind of diode, however, the extent of applications thereof has further spread to include office automation such as light sources for facsimiles, duplicating machines, printers, outdoor displays such as traffic signals, and a communication area such as optical communications in combination with optical fibers, etc.

Thus, light-emitting diodes are now expected to enjoy a remarkably increasing demand as a solid-state light source.

By the way, initially in history, a red light emitting diode of GaP and GaAsP was employed for red light emitting purpose. A single hetero structure used of GaAlAs was thereafter developed for improving the luminance thereof. Recently the use of GaAlAs substrate and a double hetero junction structure prepared so as to effect confinement of carriers into the active layer region has enabled the luminance to be increased (1,000 mcd and more ($I_F$=20 mA)) and the rise time to be shortened (20 nsec).

GaAlAs compound semiconductors are a mixed crystal of GaAs and AlAs, both of which are III-V compound semiconductors. Change in the AlAs mole fraction of the mixed crystal within the range of direct transition type enables light beams having wavelengths ranging from approximately 640 to 880 nm to be sent out. The longer the wavelength at which light is emitted, the higher the efficiency with which light is emitted. On the contrary, the shorter wavelengths of the emitted light are, the lower the efficiency to an utmost extent under the influence of indirect transition gets. Where the AlAs mole fraction is 0.37 or less, the band structure tends to show the characteristics of direct transition type, while the AlAs mole fraction is more than 0.37, the band structure has a tendency of indirect transition type.

A GaAlAs ultrahigh luminance red light-emitting diode with a double hetero structure is prepared as follows. A liquid phase epitaxial growth method is applied to grow, with slow cooling process, a p-type high AlAs mole fraction GaAlAs thick-film single crystal, which finally becomes a substrate, on GaAs single-crystal substrate which is manufactured by a melt growth method such as, for example, a liquid encapsulated Czochralski method. On this p-type GaAlAs thick-film single crystal layer there are sequentially grown a p-type high AlAs mole fraction GaAlAs clad layer, a GaAlAs active layer having an AlAs mole fraction which determines the wavelength of the emitted light, and an n-type high AlAs mole fraction clad layer in the order mentioned before so that a four-layer structure for a light emitting device is formed. It is to be noted that the GaAs single-crystal layer, which has been used as a substrate for initial epitaxial growth, may be removed after said p-type high AlAs mole fraction GaAlAs thick-film single crystal layer has been grown, or alternatively the substrate may be removed just prior to entering the manufacturing process of the device after the formation of the above-mentioned n-type clad layer.

The p-type high AlAs mole fraction GaAlAs thick-film single crystal layer which is the first epitaxial layer is required to be low in absorbance of light generated, to be low in specific resistance, to be good in forming ohmic contacts, and to be thick enough to make it easy to handle as a substrate in the succeeding process. For instance, the p-type GaAlAs thick-film single crystal layer which has an active impurity concentration of, for example, 3 to $5 \times 10^{17}$ cm$^{-3}$ in case of using Zn as a dopant, a specific resistance of 0.3 $\Omega$cm, and a thickness of 150 to 200 $\mu$m is adopted. The AlAs mole fraction is chosen to be so high as to make the absorbance of generated light small, e.g., 0.65 to 0.8. The difference in the crystal lattice spacing between the first epitaxial growth layer and the GaAs single crystal is only 0.14%, so that there is almost no fear that crystallographic defects occur due to the difference in lattice spacings.

Selection of an AlAs mole fraction of 0.8, for example, for this kind of p-type high AlAs mole fraction GaAlAs thick-film layer causes the surface of the layer to be easily oxidized due to high Al content, which inevitably results in a formation of an Al oxide film on the thick-film layer due to contact with oxygen in the environmental air by the time the growth of the aforementioned clad layers or active layer begin thereon. This in turn hinders the epitaxial growth of both of the clad layers and the active layer to a great extent. This hindrance means, for instance, an irregular growth interface or the degradation of the crystallinity due to occurrence of crystal defects. The following values of AlAs mole fractions, dopants, concentrations thereof and thicknesses are adopted for a p-type clad layer, an active layer and an n-type clad layer. The above-mentioned hindrance to epitaxial growth has a serious influence on the active layer which is an active layer for emittance of light. This hindrance causes the interface to be irregular between the active layer and the clad layer or causes the crystallinity of the active layer itself to be degraded, which causes the light emitting efficiency to be remarkably lowered.

| | (AlAs mole) fraction) | (Dopant) | (Concentration) | (Thichkness) (μm) |
|---|---|---|---|---|
| p-Type Clad Layer | 0.8 | Zn | $1 \times 10^{17}$ cm$^{-3}$ | approx. 50 |
| Active Layer (Non-Doped) | 0.38 | none | — | 0.5 to 1 |
| n-Type Clad Layer | 0.8 | Te | $2 \times 10^{17}$ cm$^{-3}$ | approx. 30 |

The above respective specifications of the two clad layers and active layer will now be briefly explained. Firstly, in order to provide a window effect (a clad layer will function as a window, passing photons having energy less than the band gap of the clad layer), the respective AlAs mole fractions of the two clad layers are determined in accordance with the wavelength of the light to be emitted from the active layer. The AlAs mole fraction of the active layer corresponds to the wavelength of the light desired to be emitted, and in this case, corresponds to the emission of red light which has wavelengths in the vicinity of 660 nm. The dopant level or concentration is selectively determined so that the light emission efficiency of the active layer may be maximized. In regard to the thickness of the epitaxial layer, the thickness of the active layer preferably must be small from the theoretical point of view. The most suitable value of the thickness of the active layer is selected in order to improve the crystallinity and to eliminate a harmful effect on the regularity of the interface of the epitaxial layer and the clad layer. The thickness of the clad layers is so selected as to improve crystallinity and to prevent troubles at the time of the device manufacturing processes. The above-mentioned thick-film layer may be grown so thick that it can function as a substrate. The epitaxial growth of this thick layer is suspended at a certain point when the thickness is enough for the purpose on the way of the epitaxial growth process. Further, the epitaxial growth of the two clad layers and the active layer are added therebetween on the substrate. Thus, the manufacturing processes of the GaAlAs light emitting semiconductor device is ordinarily performed on a discontinuity basis. Once a thick film layer is grown to be formed on a GaAs substrate and taken out of the furnace, it is difficult to prevent the surface of the thick-film layer from oxidation even if the GaAs substrate with the thick layer is protected in an atmosphere of an inert gas. When taken out of the furnace, an oxide film is formed on the thick-film layer. When two clad layers and an active layer therebetween are additionally grown onto the thick-film layer with the oxide film left thereon, an intervention of the oxide film in addition to the presence of the above-mentioned drawback causes an increased electric resistance to degrade the electric characteristics such as rise time. Accordingly, in order to eliminate these drawbacks a method is contrived wherein the oxide film is removed together with the substrate by a few micro-meters. Anyway, it frequently occurs that the oxide film keeps the growth surface from growing uniform. Another proposed method to eliminate said drawbacks is disclosed in Japanese Patent Unexamined Publication No. 62-14420, wherein a GaAs single-crystal thin film of, for example, 5 μm thick is grown to form a protective film on the thick-film layer by use of a second solution for crystal growth so that the thin film can protect the thick-film layer from oxidation. Thereafter, the oxidation-resisting thin film is removed by melt-back treatment immediately preceding a next process step.

The present invention has been made in view of the fact that the protective film on the thick-film layer has a serious drawback in manufacturing a GaAlAs light-emitting semiconductor device having a double-hetero junction structure, the manufacture of which is the purpose of this invention, and that drastic changes are necessary for eliminating such a drawback. The reasons therefor are as follows.

Where a GaAs film or a GaAlAs film having only a low AlAs mole fraction of x<0.05 is grown for protection as in the above-mentioned case, a contact of a solution for growing the protective film with a high AlAs mole fraction thick-film layer having such a ratio as $Ga_{0.2}Al_{0.8}As$ causes an Al atomic fraction of a Ga solution and an AlAs mole fraction of the GaAlAs compound semiconductor single-crystal to be deviated remarkably each other from an equilibrium value, resulting in a serious unstable phase equilibrium between the solid phase and the liquid phase. More specifically, since the Al atomic fraction in the solution to be equilibrated with the AlAs mole fraction of 0.8 in the thick film is 0.022, when a Ga solution which is in phase equilibrium with a low Al containing GaAlAs layer to be deposited is allowed to contact a solid phase having an AlAs mole fraction of 0.8 and thereafter is subjected to cooling, the liquid phase causes the GaAlAs layer to begin its growth, but at the same time, the original solid phase is also vigorously eluted so as to equilibrate the AlAs mole fraction in the solid phase with the Al atomic fraction in the solution. In the case where both are largely deviated from the value of equilibrium, the solution should be maintained at a high degree of supersaturation so that, after its contact with the solid phase, crystal growth can be started at a rate higher than that at which the solid phase is eluted. However, it is difficult to control such high degree of supersaturation during the continuous growth process. For this reason, the growth interface becomes non-uniform and microscopically fluctuated.

In the technique disclosed in Japanese Patent Unexamined Publication No. 62-14420, a Ga solution without any solute is employed for the performance of a melt-back treatment. The reason for this is considered to lie in the respect that the solution for forming the p-type clad layer fails to be employed for melt-back treatment for the same reasons as mentioned above. However, even if the melt-back of the GaAs protective layer has been successfully performed, contact of an Al free Ga solution used for the melt-back treatment, with a high Al containing layer after the solution has completed melt back of the protective layer allows the phase equilibrium to be remarkably subjected to change, causing the elution of the solid phase and the deposition from the liquid phase to occur at the same time and thereby letting the interface be fluctuated. Therefore it is extremely difficult to prevent such fluctuations. The non-uniformity of the surface of the thick-film layer, which inherits at the time of deposition thereto of the GaAs protective layer, is memorized on the surface of the clad layer.

In addition, need of another solution for melt-back treatment undesirably makes the process more troublesome.

The influence which the phase equilibrium gives to growth interface in case of $Ga_{1-x}Al_xAs$ crystal growth and of melt-back process will be described.

In the case where the $Ga_{1-x}Al_xAs$ crystal is grown by the liquid phase epitaxial growth method (LPE method), growth of crystal is effected in general by using Ga as a solvent and GaAs and Al as a solute to thereby prepare a growth solution. In this case, the AlAs mole fraction x in the grown crystal is determined by the growth temperature and the Al atomic fraction in the growth solution as shown in FIG. 5. Namely, FIG. 5 graphically shows at each temperature the relationship between the Al atomic fraction $X_{Al}$ in the liquid phase (growth solution) and the corresponding AlAs mole fraction x in the solid phase (grown crystal) which is in phase equilibrium with the liquid phase. According to this graphic diagram, when it is desired to obtain a mixed crystal having an AlAs mole fraction x of 0.8 at a temperature of, for example, 900° C., a liquid phase at a point A shown is necessary, so that growth of crystal starts to be effected from the Al mixed solution having an Al atomic fracion $x_{Al}=0.022$. In other words, since the liquid phase epitaxial growth is effected in accordance with the phase equilibrium, the solution having an Al atomic fraction of $x_{Al}=0.022$ and the $Ga_{1-x}Al_xAs$ mixed crystal having an AlAs mole fraction of $x=0.8$ can be said to be in phase equilibrium at 900° C. Accordingly, the surface of the crystal grown from the solution by slow cooling process, or the surface of the crystal resulting from the melt-back treatment carried out by slow rising of temperature, show a good smooth one because crystal growth or melt-back is effected in a state of near phase equilibrium.

However, in the case where crystal growth or melt-back is effected with both the solid phase and liquid phase being kept largely out of equilibrium, for example, in the case where the saturated solution having almost no Al content as shown at a point B in FIG. 5 and the $Ga_{1-x}Al_xAs$ mixed crystal having an AlAs mole fraction of $x=0.8$ are caused to contact with each other at 900° C., the protective layer starts to grow. On the other hand, however, the solid phase and the liquid phase act to diminish the discrepancy from the phase equilibrium, so that elution of Al from the $Ga_{0.2}Al_{0.8}As$ mixed crystal takes place so as to supply Al to the liquid phase. In consequence, the interface between the solid and liquid phases become unstable. Thus, good crystal growth is unlikely to occur at the interface.

SUMMARY OF THE INVENTION

The present invention has been made in view of the above-described problems and an object thereof is to provide a GaAlAs light-emitting semiconductor device substrate which is capable of preventing the oxidation of the thick film layer and, thereafter, preparing an oxidation-retarding protective film layer having a smooth crystal growth interface and melt-back surface and which has an economical structure serving as substrate to shorten the process step involved, and a method of manufacturing the same.

To attain the above object, according to a first aspect of the present invention, there is provided a light-emitting semiconductor device substrate which comprises a GaAs single-crystal substrate, a $Ga_{1-x}Al_xAs$ compound semiconductor single-crystal thick-film layer having a first mole fraction of $(0.6 < X < 0.85)$, and a surface-protective film layer consisting of a $Ga_{1-y}Al_yAs$ compound semiconductor single-crystal thin-film layer having a second mole fraction of $(0.05 < y < 0.3)$, the thin-film layer having a low Al content and the capability of retarding the oxidation of the thick-film layer, the thick-film layer and thin protective film layer being epitaxially grown on the GaAs single-crystal substrate in the order mentioned above, whereby the GaAs single-crystal substrate is removed by a mechanical and/or chemical method after completion of the epitaxial growth process steps.

Further, according to a second aspect of the present invention, there is provided a method of manufacturing a light-emitting semiconductor device substrate which comprises the step of causing a $Ga_{1-x}Al_xAs$ compound semiconductor single-crystal thick-film layer having a first mole fraction of $(0.6 < X < 0.85)$ to be epitaxially grown on a GaAs single-crystal substrate, the step of causing a $Ga_{1-y}Al_yAs$ compound semiconductor single-crystal protective thin-film layer having a second mole fraction of $(0.05 < y < 0.3)$ to be epitaxially grown on the thick-film layer in order to retard the oxidation of the thick-film layer, and the step of removing the GaAs single-crystal substrate by mechanical and/or chemical method after the growth of the protective thin-film layer.

According to the present invention, a growth of $Ga_{1-y}Al_yAs$ protective film layer having a low AlAs mole fraction $(0.05 < y < 0.3)$ on the GaAlAs thick-film layer effectively inhibits the thick-film layer from being oxidized, which results in elimination of various inconveniences caused by oxidation. In addition, the inhibition of oxidation by virtue of the protective film and the AlAs mole fraction y of at least 0.05 or more cause the discrepancy from the phase equilibrium between the solid phase and the liquid phase to be diminished in case of the growth of said protective film on the thick-film layer which also contains Al and also at the time of the removal of the protective film by means of a melt-back treatment. This results in realization of a smooth crystal growth interface and melt-back surface.

Further, at the time of melt-back treatment, no special solution is required to be used for that exclusive purpose. That is, the use of a solution intended to grow the clad layer allows the process step to be simplified.

The upper limit of the AlAs mole fraction in the protective film has been experimentally confirmed. Namely, when the AlAs mole fraction is $y=0.3$, the rate of oxidation is low and no such oxide film as becomes an obstacle to the treatment in the next process step is formed on the surface of the protective film, even if the same is left exposed to an ordinary indoor atmosphere. In addition, when the protective film is formed on the high AlAs mole fraction $(0.6 < X < 0.85)$ thick film, the AlAs mole fraction of the protective film and the Al atomic fraction in the solution for growing such a protective film tend to have a deviation from the phase equilibrium therebetween. Both the protective film and the solution contain Al of necessary levels anyway, however, with the result that little deviation will be generated. The interface between the protective film and the thick-film layer is easy to be kept uniform. Likewise, in the next process step where the protective film is allowed to contact a solution for growing a high AlAs mole fraction clad layer (for instance, $0.6 < z < 0.85$ for $Ga_{1-z}Al_zAs$), which means that a protective film is subjected to melt-back treatment, both the protective film and the solution contain Al. Little deviation from the phase equilibrium therebetween allows the exposed surface of the thick film produced after the melt-back treatment of the protective film to become uniform with ease. In case of the lowest AlAs mole fraction of 0.05, the oxidation-resisting protective layer not only can sufficiently serve as a protective layer but also produces a sufficiently uniform protective film growth interface and a sufficiently uniform exposed surface of the thick-film layer after melt-back treatment.

BRIEF DESCRIPTION OF THE DRAWINGS

FIGS. 1(a) to 1(d), FIGS. 2(a) to 2(e) and FIGS. 3(a) to 3(d) illustrate the process steps, in the sequential order, of manufacturing a light-emitting semiconductor device substrate in accordance with the method of the present invention;

DESCRIPTION OF THE PREFERRED EMBODIMENT

An embodiment of the present invention will now be described with reference to the accompanying drawings.

FIGS. 1(a), 1(b), 1(c) and 1(d) illustrate in the sequential order the process (slide boat method) of manufacturing a light-emitting semiconductor device substrate (see FIG. 3(a)) in accordance with the present invention.

Figure 1A:
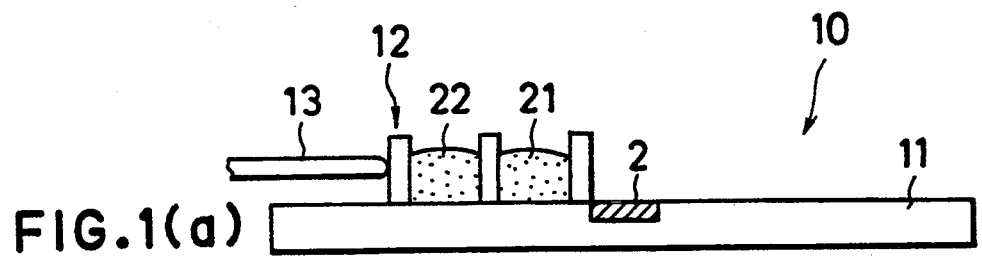

As shown in FIG. 1(a), a p-type GaAs crystal substrate 2 is set in a substrate holder 11. A solution holder 12 which is slidable on the substrate holder 11 has two solution pools, in which a first solution 21 for crystal growth for forming a p-type $Ga_{0.2}Al_{0.8}As$ thick film layer 3 (see FIG. 3(a)) and a second solution 22 for crystal growth for forming a $Ga_{1-y}Al_yAs$ protective film 4 ($0.05 < y < 0.3$)(see FIG. 3(a)) are received, respectively. It is to be noted that a reference numeral 13 in FIG. 1 denotes an operation bar for sliding the solution holder 12.

Figure 1B:
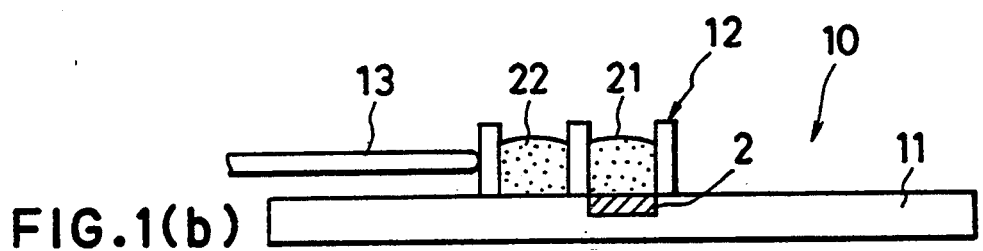
Figure 1C:
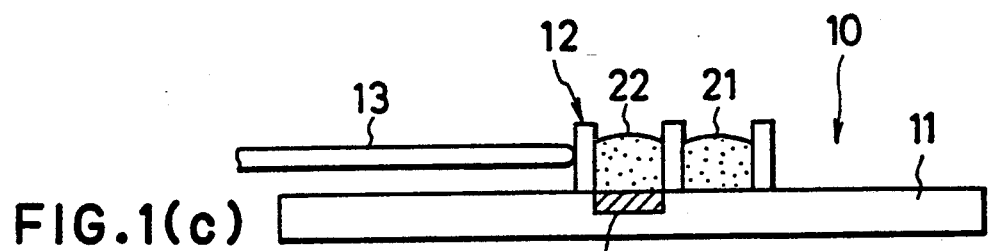
Figure 1D:
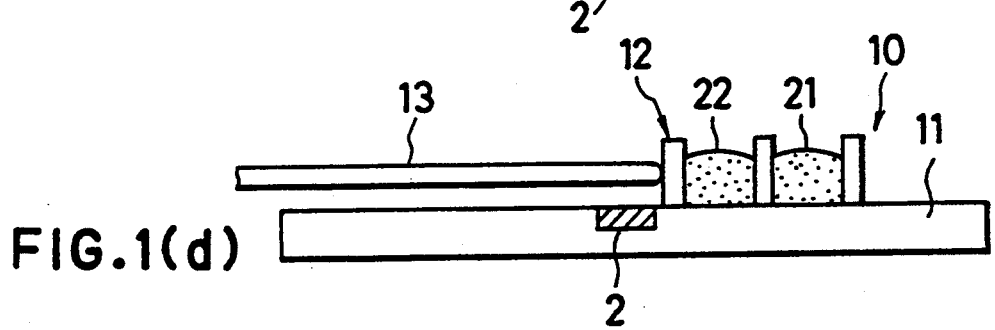

The GaAs crystal substrate 2, the first solution 21 for crystal growth composed of a Ga metal of 100 g, a GaAs polycrystal of 10.6 g, an Al metal of 850 mg and a Zn metal of 120 mg, and the second solution 22 for crystal growth composed of a Ga metal of 100 g, a GaAs polycrystal of 12.3 g, an Al metal of 36.2 mg and a Zn metal of 120 mg are charged into a boat 10. Then, the boat 10 is put into a liquid phase epitaxial furnace not shown and then the temperature is raised in an atmosphere of hydrogen gas. Subsequently, when the temperature has reached a specified value (for example, 950° C.), this raised temperature is maintained for a specified time period (for example, 120 minutes). Thereafter, by operating the operation bar 13, the solution holder 12 is slid on the substrate holder 11 so as to cause the first solution 21 for crystal growth to contact with the surface of the GaAs crystal substrate 2 as shown in FIG. 1(b). At substantially the same time, the furnace temperature is lowered at a specified cooling rate of 0.4° C./min. When, thereafter, the furnace temperature has reached, for example, 750° C., the operation bar 13 is again operated so as to cause the second solution 22 for crystal growth to be set on the GaAs crystal substrate 2 as shown in FIG. 1(c). Thereafter, when, for example, five minutes have lapsed, the solution holder 12 is slid beyond the GaAs crystal substrate 2 by operation of the operation bar 13. Then, the hydrogen gas in the liquid phase epitaxial furnace is replaced by argon gas. Then, the furnace is switched off.

The structure of the light-emitting semiconductor device substrate 1 thus obtained is shown in FIG. 3(a). Namely, as shown, on the GaAs crystal substrate 2 there is deposited the p-type $Ga_{0.2}Al_{0.8}As$ thick-film layer 3 having a thickness of 100 μm or more. On this thick layer 3 there is deposited the $Ga_{1-y}Al_yAs$ protective film 4 having a thickness of 10 μm or less. Since the thick-film layer 3 is covered by the $Ga_{1-y}Al_yAs$ protective film 4 having a low AlAs mole fraction y ($y < 0.3$), the oxidation thereof is effectively suppressed with the result that various inconveniences attributable to the oxidation of the thick-film layer 3 are eliminated.

Figure 4A:
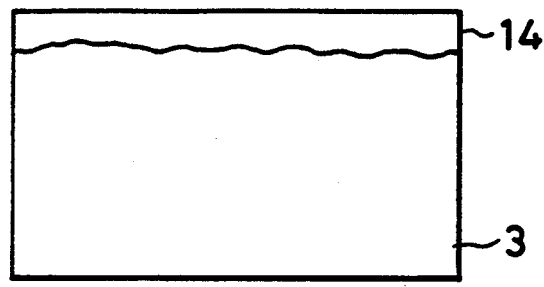
FIGS. 4(a), 4(b) and 4(c) show the states of the growth interfaces of the protective film layer and the clad layers.
Figure 4B:
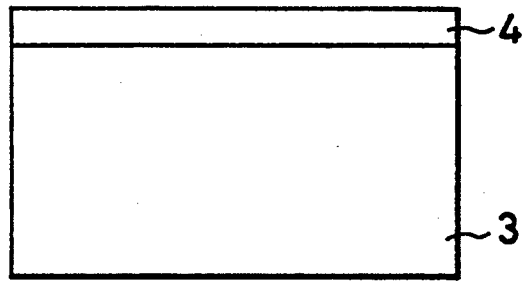

Furthermore, an AlAs mole fraction of $0.05 < y$ in the protective film 4 permits the discrepancy from the phase equilibrium between the solid phase (thick-film layer 3) and the liquid phase (second solution 22 for crystal growth) at the time of the growth of the protective film 4 on the thick-film layer 3 which also contains Al to be diminished, thereby the fluctuations at the interface (between the thick-film layer 3 and the protective film 4) are restricted from occurrence to obtain a smooth crystal interface with ease. A crystal growth interface of the protective film 14 in the case where the same is composed of GaAs, according to the prior art, is shown in FIG. 4(a) while the crystal growth interface of the protective film 4, according to the method of the invention, is shown in FIG. 4(b). It is to be noted that when it is desired to obtain a smoother crystal growth interface, the $Ga_{1-y}Al_yAs$ protective film 4 had better have an AlAs mole fraction y of greater value. If this value is set such that $y > 0.3$, however, oxidation of the protective film 4 takes place more vigorously as the y value increases, thus raising a problem.

In the case where the protective film is composed of Ga and As free of Al, a GaAlAs crystal having high content of AlAs, such as $Ga_{0.2}Al_{0.8}As$ crystal (thick-film layer 3), is eluted. Thus, it is difficult to make the film a uniform single crystal. In some extreme cases, void creation takes place. In addition, growth of crystal at a uniform rate fails to be effected at the epitaxial growth interface, so that crystal defects such as grain boundary, dislocation, etc. are likely to be produced. Such undesirable crystal growth is considered to be attributable to the fluctuations in the crystal growth interface. In the present invention, however, the above-mentioned undesirable crystal growth does not take place. Namely, in the present invention, the crystal growth interface is ideally flat.

On the thick-film layer 3 of the light-emitting semiconductor device substrate 1 thus obtained there are formed by the liquid phase epitaxial growth method a p-type GaAlAs clad layer 5, a GaAlAs active layer 6 and n-type GaAlAs clad layer 7 in the order mentioned, said three layers constituting a double hetero junction structure, as shown in FIG. 3(b). This formation will now be described with reference to FIGS. 2(a) to 2(e).

Figure 2A:
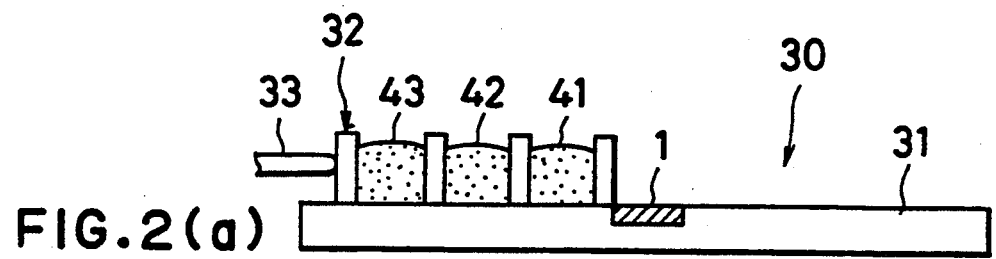

Namely, FIGS. 2(a) to 2(e) illustrate in the sequential order of process steps in a manufacturing method (slide boat method) for obtaining a light-emitting semiconductor device substrate 8 shown in FIG. 3(b). As shown in FIG. 2(a), the light-emitting semiconductor device substrate 1 having a structure shown in FIG. 3(a) is set in a substrate holder 31. Solution holder 32 slidable on the substrate holder 31 defines three solution pools. In these three solution pools, there are accommodated a first solution 41 for crystal growth intended to form the p-type $Ga_{0.2}Al_{0.8}As$ clad layer 5, a second solution 42 for crystal growth intended to form the $Ga_{0.7}Al_{0.3}As$ active layer 6, and a third solution 43 for crystal growth intended to form the n-type $Ga_{0.2}Al_{0.8}As$ clad layer 7. In FIG. 2, numeral 33 denotes an operation bar connected to the solution holder 32 for sliding. Further, the first solution 41 for crystal growth contains a Ga metal of 100 g, a GaAs polycrystal of 4.0 g, an Al metal of 480 mg, and a Zn metal of 60 mg, the second solution 42 for crystal growth contains a Ga metal of 100 g, a GaAs polycrystal of 6.0 g, and an Al metal 115 mg, and the third solution 43 for crystal growth contains a Ga metal of 100 g, a GaAs polycrystal of 4.0 g, an Al metal of 480 mg, and a Te metal of 1.0 mg.

Figure 2B:
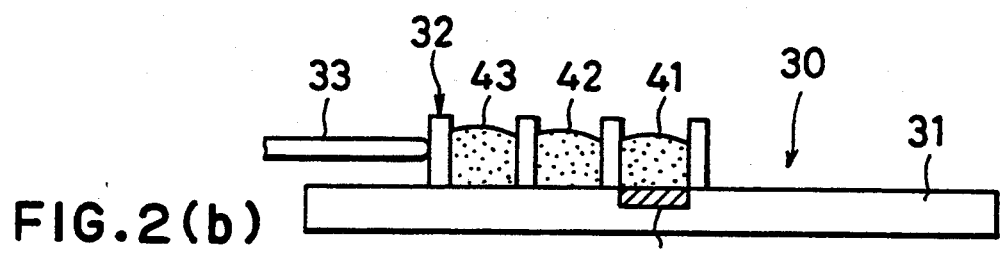

The light-emitting semiconductor device substrate 1 and the first, second and third solutions 41, 42 and 43 for crystal growth are put into a boat. Then, the resulting boat is introduced into a liquid phase epitaxial growth furnace not shown. Then, this furnace is heated to raise the temperature thereof in an atmosphere of hydrogen gas. When the furnace has reached a specified temperature (for example, 850° C.), this temperature is maintained for a specified time period (for example, 120 minutes). Thereafter, the solution holder 32 is slid on the substrate holder 31 so as to permit the first solution 41 for crystal growth to contact with the surface of the GaAlAs protective film 4 of the light-emitting semiconductor device substrate 1, as shown in FIG. 2(b). This contact is maintained for about five minutes at said specified temperature. Then, the $Ga_{1-y}Al_yAs$ protective film 4 ($0.05 < y < 0.3$) is molten back by the first solution 41 for crystal growth, and thus is extinguished. At the time of this melt-back process, the Al content in the protective film 4 allows the deviation from the phase equilibrium between the solid phase (the protective film 4) and the liquid phase (the first solution 41 for crystal growth) to be kept to a small extent so that the disorder of the interface between the solid phase and liquid phase is restricted because of the above mentioned reasons, which results in an achievement of a smooth melt-back surface.

Figure 2C:
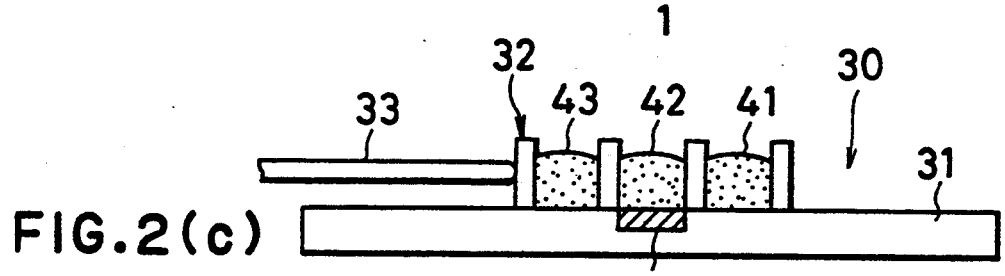
Figure 2D:
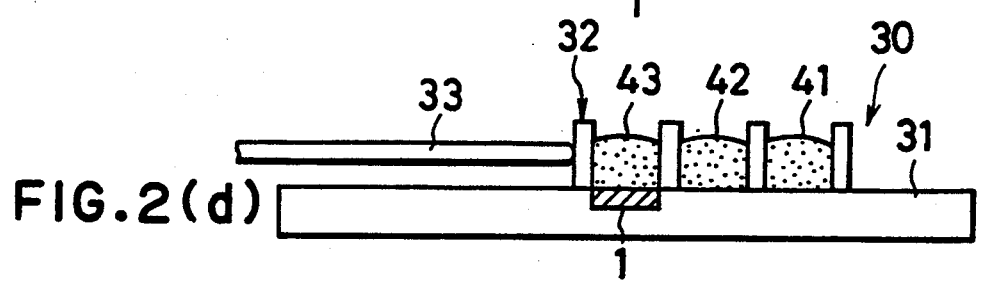
Figure 2E:
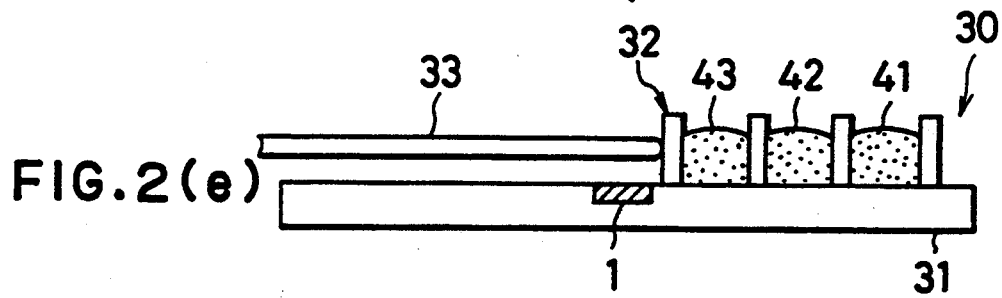

Next, the temperature of the furnace is decreased at a constant cooling rate of, for example, 0.3° C./min. Then, as shown in FIG. 2(c), the second solution 42 for crystal growth is set on the light-emitting semiconductor device substrate 1. When, thereafter, for example, 30 seconds have lapsed, the third solution 43 for crystal growth is set on the position of the light-emitting semiconductor device substrate 1 as shown in FIG. 2(d). Thereafter, when the furnace temperature has reached, for example, 750° C., the solution holder 32 is slid beyond the position of the light-emitting semiconductor device substrate 1 as shown in FIG. 2(e). Then, the hydrogen gas is replaced by argon gas and then the furnace is switched-off.

Figure 4C:
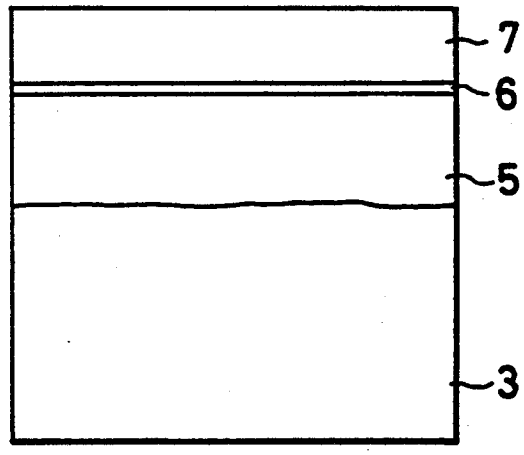
Figure 5:
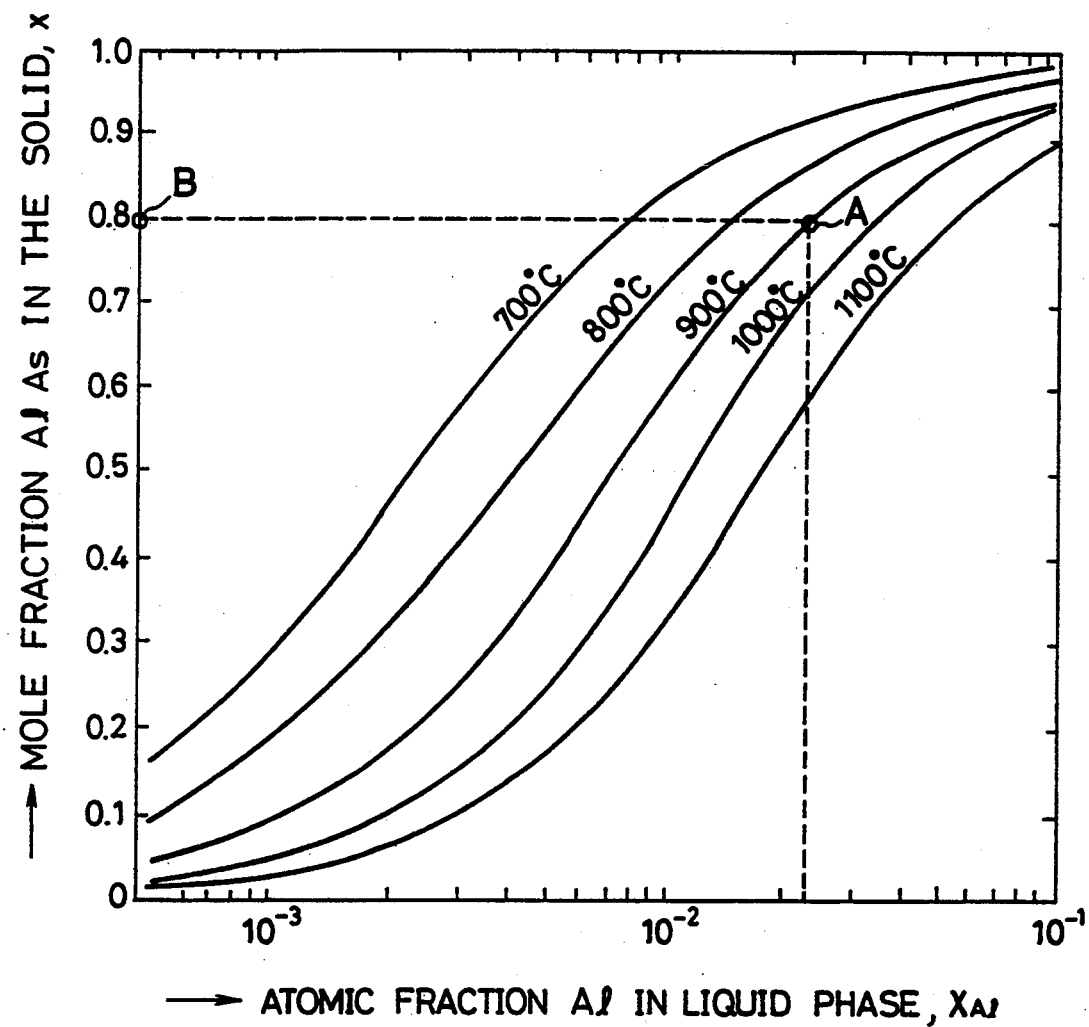
FIG. 5 graphically shows the relationship between the Al atomic fraction in the liquid phase and the AlAs mole fraction x in the solid phase being phase-equilibrated therewith.

The structure of the light-emitting semiconductor device substrate 8 obtained as above by the growth of crystal is shown in FIG. 3(b). As shown, on the thick film layer 3 there are deposited the p-type GaAlAs clad layer 5, the GaAlAs active layer 6 and the n-type GaAlAs clad layer 7 in the order mentioned. Note that a state of the growth interface of the clad layer 5 after melt-back is shown in FIG. 4(c).

Incidentally, since the p-type GaAs crystal substrate 2 of the light-emitting semiconductor device substrate 8 absorbs the light generated, the substrate 2 is removed so as to enhance the external light-emitting efficiency, thus obtaining a light-emitting semiconductor device 9 shown in FIG. 3(c).

On the underside of the thick-film layer 3 of the light-emitting semiconductor device 9 having the shown construction there are provided Au-based p-type electrodes 51, 51, and on the upside of the n-type clad layer 7 there is provided an Au-based n-type electrode 52, thereby obtaining a chip 50 shown in FIG. 3(d).

As clear from the foregoing description, according to the present invention, the p-type GaAlAs thick-film layer and $Ga_{1-y}Al_yAs$ protective film intended to prevent oxidation thereof are sequentially grown on the p-type GaAs-crystal substrate in the order mentioned to obtain a light-emitting semiconductor device substrate. For this reason growth of the $Ga_{1-y}Al_yAs$ protective film having a low AlAs mole fraction ($0.05 < y < 0.3$) on the GaAlAs thick-film layer prevents the thick film layer from being oxidized owing to the protective film effectiveness, with the result that an effect is obtained that various troubles caused by oxidation are eliminated. In addition, according to the present invention, the content of Al in the protective film keeps the deviation from the phase equilibrium between the liquid phase and the solid phase to a small extent at the time of the growth of the protective film on the Al containing thick-film layer and at the time of the removal of the protective film by the melt-back process. This brings about an effect that a smooth crystal growth interface and a smooth melt-back surface can be obtained.

What is claimed is:

1. A method of manufacturing a light-emitting semiconductor device substrate used in forming of a GaAlAs double hetero junction structure, comprising:

the step of continuously causing $Ga_{1-x}Al_xAs$ compound semiconductor single crystalline thick-film layer of a first AlAs mole fraction ($0.6 < X < 0.85$) and a surface protective film consisting of a low Al containing and oxidation-delaying $Ga_{1-y}Al_yAs$ compound semiconductor single crystalline thin-film layer of a second AlAs mole fraction ($0.05 < y < 0.3$) to be grown without interruption in a liquid phase epitaxial method on a GaAs crystal substrate in the order mentioned, and removing said oxidation-delaying $Ga_{1-y}Al_yAs$ compound semiconductor single crystalline thin-film layer by melt-back.

2. The method of manufacturing a light-emitting semiconductor device substrate according to claim 1, wherein said GaAs crystal substrate is removed after said thick-film layer and said thin-film layer are sequentially grown in an epitaxial method on said GaAs crystal substrate in the order mentioned.

* * * * *